(12) United States Patent
Zhou

(10) Patent No.: US 11,411,570 B1
(45) Date of Patent: Aug. 9, 2022

(54) MULTI MODULUS FREQUENCY DIVIDER AND ELECTRONIC DEVICE

(71) Applicant: HANGZHOU GEO-CHIP TECHNOLOGY CO., LTD., Hangzhou (CN)

(72) Inventor: Yanping Zhou, Hangzhou (CN)

(73) Assignee: HANGZHOU GEO-CHIP TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 17/514,511

(22) Filed: Oct. 29, 2021

(51) Int. Cl.
*H03L 7/197* (2006.01)
*G06F 1/04* (2006.01)
*H03K 21/10* (2006.01)

(52) U.S. Cl.
CPC ............ *H03L 7/1976* (2013.01); *G06F 1/04* (2013.01); *H03K 21/10* (2013.01)

(58) Field of Classification Search
CPC .......... H03L 7/1976; G06F 1/04; H03K 21/10
See application file for complete search history.

(56) References Cited

U.S. PATENT DOCUMENTS

| | | | | |
|---|---|---|---|---|
| 3,943,379 A * | 3/1976 | McGuffin | ............. | H03K 23/544 377/115 |
| 4,931,748 A * | 6/1990 | McDermott | ............. | H03L 7/14 331/25 |
| 5,963,071 A * | 10/1999 | Dowlatabadi | ...... | H03K 5/00006 327/276 |
| 6,094,466 A * | 7/2000 | Yang | ...................... | H03K 23/44 377/47 |
| 6,707,326 B1 * | 3/2004 | Magoon | ................. | H03K 21/08 377/47 |
| 9,270,280 B1 * | 2/2016 | Margarit | ............... | H03K 23/667 |
| 9,438,257 B1 * | 9/2016 | Perdoor | ............... | H03K 21/026 |
| 9,543,960 B1 * | 1/2017 | He | .......... | H03K 21/10 |
| 10,749,531 B1 * | 8/2020 | Naik | ............... | H03K 21/10 |
| 10,965,297 B1 * | 3/2021 | Wu | ........ | H03L 7/0805 |
| 2007/0139088 A1 * | 6/2007 | Garlapati | ............... | H03K 21/10 327/115 |
| 2008/0136540 A1 * | 6/2008 | Li | .......................... | H03L 7/1976 327/117 |
| 2011/0234269 A1 * | 9/2011 | Yu | .......................... | H03L 7/0898 327/155 |
| 2013/0328594 A1 * | 12/2013 | Hauck | ................... | H03L 7/1976 327/1 |
| 2014/0312936 A1 * | 10/2014 | Abdel-Haleem | ...... | H03K 23/54 327/118 |
| 2016/0072509 A1 * | 3/2016 | Jia | ......................... | H03K 23/586 327/117 |

(Continued)

*Primary Examiner* — Adam D Houston
(74) *Attorney, Agent, or Firm* — Nixon & Vanderhye P.C.

(57) ABSTRACT

The present disclosure provides a multi modulus frequency divider and an electronic device. The duty cycle adjusting circuit in the multi modulus frequency divider is configured to generate a second output clock signal according to a first output clock signal and an input modulus signal received by one or more frequency division units, the frequency of the second output clock signal is the same as that of the first output clock signal, and the duty cycle of the second output clock signal is different from that of the first output clock signal. The duty cycle of the clock signal output by the multi modulus frequency divider provided in the present disclosure is generally closer to 50%.

14 Claims, 11 Drawing Sheets

(56) References Cited

U.S. PATENT DOCUMENTS

2016/0173111 A1* 6/2016 Cali ..................... H03L 7/1976
                                                      327/156
2018/0054203 A1* 2/2018 Drost ................... H03K 21/026
2019/0386644 A1* 12/2019 Baladhandapani ....... H03L 7/14
2021/0391864 A1* 12/2021 Rafi ....................... H03L 7/143

* cited by examiner

MULTI MODULUS FREQUENCY DIVIDER AND ELECTRONIC DEVICE

TECHNICAL FIELD

The present disclosure relates to the technical field of digital circuits, and in particular, to a multi modulus frequency divider and an electronic device.

TECHNICAL BACKGROUND

Multi Modulus Frequency Divider (MMD), also referred to as multi modulus programmable frequency divider, can lower the frequency of an input clock signal according to a frequency division ratio that is adjustable.

In the prior art, "A Scalable Synchronous Reload Technique for Wide Division Range Multi Modulus Dividers" published at the IEEE International Conference on Electronics, Circuits, and Systems (ICECS) conference in 2015 proposes a technique for extending the frequency division ratio, which realizes switching of different frequency division ratios by a frequency divider in a golden state using extension-stage circuits, i.e. multiple modulus extensions, so that the multi modulus frequency divider can operate normally when its frequency division ratios are arbitrarily switched.

However, the duty cycle of the clock signal output by the multi modulus frequency divider is not ideal in the prior art.

SUMMARY

The present disclosure aims to provide a multi modulus frequency divider with an optimized duty cycle of its output clock signal and frequency division ratios that can be switched arbitrarily.

In order to solve the above technical problems, the present disclosure provides a multi modulus frequency divider including a plurality of frequency division units connected in cascade, a clock output circuit, and a duty cycle adjusting circuit.

Each of the plurality of frequency division units, which includes a plurality of D flip-flops and a combinational logic unit, is configured to divide the frequency of the received clock signal by N or by N+1 depending on the corresponding received divisor control signal and the corresponding input modulus signal, and an output of the preselected one of the D flip-flops in each of the plurality of frequency division units serves as a state output of the frequency division unit, where N is an integral larger than 1.

The clock output circuit is configured to generate a first output clock signal according to the state outputs of at least two of the plurality of frequency division units, and a state code combination composed of the state codes of the plurality of frequency division units is the same for any of the frequency division ratios supported by the multi modulus frequency divider before a rising edge of the first output clock signal.

The duty cycle adjusting circuit is configured to generate a second output clock signal according to the rising edge of the first output clock signal and the input modulus signal received by one or more of the plurality of frequency division units, where the frequency of the second output clock signal is the same as that of the first output clock signal, and the duty cycle of the second output clock signal is different from that of the first output clock signal.

In order to solve the above technical problems, the present disclosure provides a technical solution in which a multi modulus frequency divider includes a plurality of frequency division units connected in cascade, a clock output circuit, and a duty cycle adjusting circuit.

Each of the plurality of frequency division units, which includes a plurality of D flip-flops and a combinational logic unit, is configured to divide the frequency of the received clock signal by N or by N+1 depending on the corresponding received divisor control signal and the corresponding input modulus signal, and an output of the preselected one of the D flip-flops in each of the plurality of frequency division units serves as a state output of the frequency division unit, where N is an integral larger than 1.

The clock output circuit is configured to generate a first output clock signal according to the state outputs of at least two of the plurality of frequency division units, and a state code combination composed of the state codes of the plurality of frequency division units is the same for any of the frequency division ratios supported by the multi modulus frequency divider before a falling edge of the first output clock signal.

The duty cycle adjusting circuit is configured to generate a second output clock signal according to the falling edge of the first output clock signal and the input modulus signal received by one or more of the frequency division units, in which the frequency of the second output clock signal is the same as that of the first output clock signal, and the duty cycle of the second output clock signal is different from that of the first output clock signal.

In order to solve the above technical problems, the present disclosure also provides a technical solution in which an electronic device includes the multi modulus frequency divider as described above.

Compared with the prior art, the present disclosure is advantageous in that one of the falling edge and the rising edge of the second output clock signal is determined by the position of the "golden state" of the first output clock signal, so that the frequency division ratios of the frequency divider can be switched arbitrarily, and the cycle of the second output clock signal is kept equal to that of the first output clock signal. Meanwhile, the other of the falling edge and the rising edge of the second output clock signal is triggered by an input modulus signal received by one or more of the plurality of frequency division units. That is, the level state of the second output clock signal changes after the level state following the outputting of the "golden state" is maintained for a period of time. Therefore, the duty cycle of the output clock signal of the multi modulus frequency divider can be optimized.

BRIEF DESCRIPTION OF THE DRAWINGS

FIGS. 1b and 1c show internal circuits of two different frequency division units in the multi modulus frequency divider shown in FIG. 1a.

FIG. 4b is a schematic diagram of the internal structure of partial elements shown in FIG. 4a.

FIG. 4c is a state transition diagram of the multi modulus frequency divider shown in FIG. 4a.

FIG. 5b is a state transition diagram of the multi modulus frequency divider in FIG. 5a which is extended relative to the multi modulus frequency divider in FIG. 4a.

FIG. 5c is a schematic diagram of a relationship between the frequency division ratio and the duty cycle of the multi modulus frequency divider shown in FIG. 5a.

FIG. 6b is a schematic diagram of a relationship between the frequency division ratio and the duty cycle of the multi modulus frequency divider shown in FIG. 6a.

DETAILED DESCRIPTION OF THE EMBODIMENTS

Figure 1A:
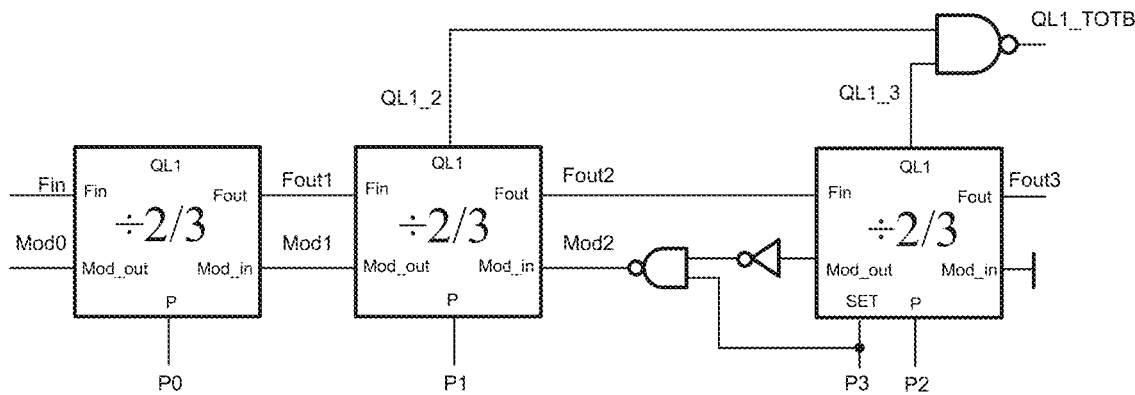
FIG. 1a is a circuit diagram of a multi modulus frequency divider in the prior art.

In the present disclosure, it should be understood that terms such as "including" and "comprising" indicate the presence of a feature, a number, a step, an operation, a component, a part or any combination thereof as described in the specification, but do not exclude a possibility of the presence of one or more other features, numbers, steps, operations, components, parts or combinations thereof.

In addition, it should be noted that the embodiments in the present disclosure and the features in the embodiments can be combined with each other if there is no conflict. Hereinafter, the present disclosure will be described in detail with reference to the drawings and in conjunction with the embodiments.

The present disclosure will be further described below in conjunction with the embodiments shown in the drawings.

FIG. 1a is an example of a multi modulus divider proposed in the reference document "A Scalable Synchronous Reload Technique for Wide Division Range Multi Modulus Dividers", and this multi modulus divider is a basic three-stage multi modulus frequency divider including three stages of frequency division units, among which the first two stages are basic frequency division units, and the third stage is an extended frequency division unit, and each of the frequency division ratios of the three frequency division units may be ½ or ⅓. According to the reference document, the minimum frequency division ratio of the three-stage multi modulus frequency divider is $Nmin=2^{n-k}$ and the maximum frequency division ratio of the three-stage multi modulus frequency divider is $Nmax=2^{n+1}-1$, where n is the total number of stages of the frequency division units, and k is the number of stages of the extended frequency division unit(s). Here, n=3 and k=1, for example, and thus the frequency division ratio ranges from 4 to 15. The frequency division ratio of the frequency divider may be represented by a four-bit binary control bit signal (also referred to as the divisor control signal hereinafter) P3P2P1P0. For example, in the case of P3P2P1P0=0100, the frequency division ratio of the frequency divider is 4; and in the case of P3P2P1P0=1111, the frequency division ratio of the frequency divider is 15.

Figure 1B:
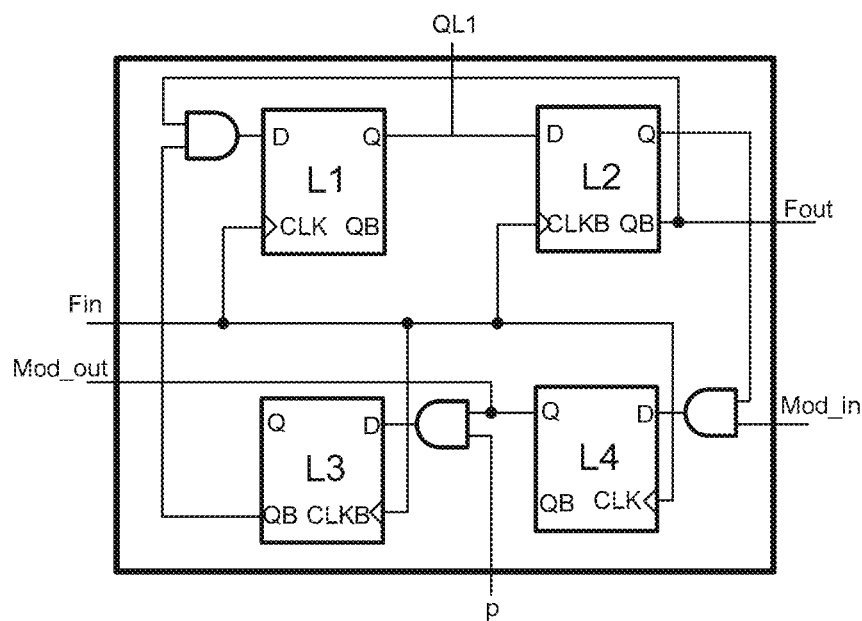

FIG. 1b shows the internal circuit of each of the first two stages of basic frequency division units in FIG. 1a, and the internal circuit is provided with signal terminals for external connections, including an input clock signal terminal Fin, an output clock signal terminal Fout for outputting a clock signal with lowered frequency, a modulus signal input terminal Mod_in, a modulus signal output terminal Mod_out, and a divisor control bit signal terminal P. The frequency division ratio, which may be for example 2 or 3, is determined by both of the input modulus signal received by the terminal Mod_in and the divisor control bit signal received by the terminal P. The shown frequency division unit contains four D flip-flops L1, L2, L3 and L4, and a state output QL1 of the D flip-flop L1 serves as a state output of the frequency division unit and may be used by the clock output circuit to generates an output signal which is referred to as a first output clock signal herein.

Figure 1C:
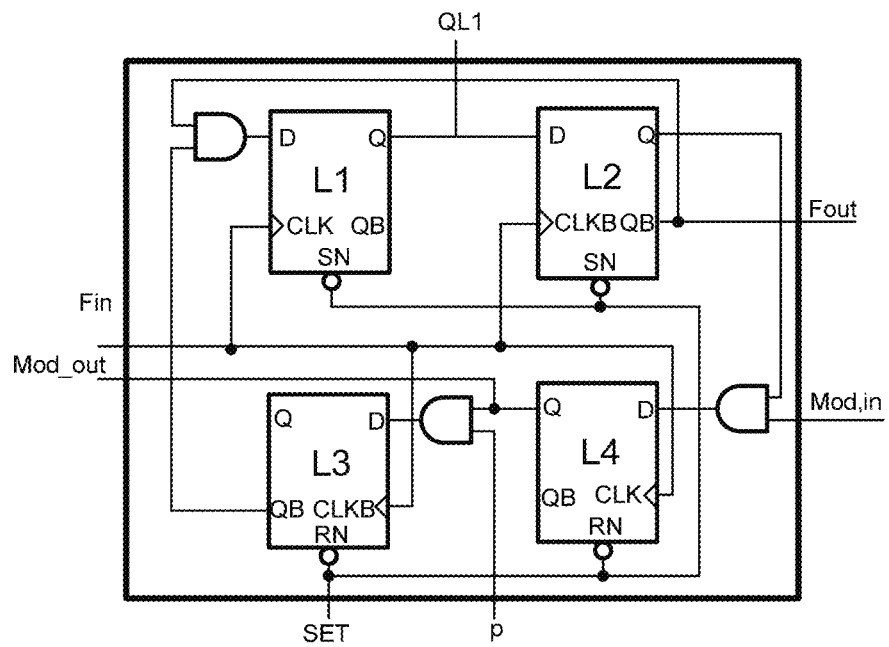

FIG. 1c shows the internal circuit of the third stage of extended frequency division unit in FIG. 1a. The extended frequency division unit likewise includes four D flip-flops, but is different from the first two stages of frequency division units in that these four D flip-flops each have a reset terminal RN or a set terminal SN, where the set terminal SN is configured to cause the D flip-flop to output 1 when a reset/set control signal terminal SET is provided with signal of 0, and the reset terminal RN is configured to cause the D flip-flop to output 0 when the reset/set control signal terminal SET is provided with a signal of 0. Since each of the D flip-flops L1 and L2 of the extended frequency division unit has a set signal terminal SN and each of the D flip-flops L3 and L4 of the extended frequency division unit has a reset terminal RN, QL1=QL2=1 and QL3=QL4=0 when the reset/set control signal terminal SET is provided with a signal of 0, where QL1, QL2, QL3 and QL4 represent the state outputs of the D flip-flops L1, L2, L3 and L4, respectively, and QL1 serves as the state output of the extended frequency division unit and has a value of 1.

As shown in FIG. 1a, the state output QL1_2 of the second-stage frequency division unit and the state output QL1_3 of the third-stage frequency division unit are inputted to an NAND gate which in turn outputs a clock signal QL1_TOTB (that is, the first output clock signal) with the lowered frequency, which may be represented by the following equation:

$$QL1\_TOTB = \overline{QL1\_2 \cdot QL1\_3}.$$

For the basic frequency division units (i.e. the first-stage and the second-stage frequency division units), the output from the output clock signal terminal Fout of the former-stage frequency division unit serves as the input to the input clock signal terminal Fin of the latter-stage frequency division unit, and the output of the modulus signal output terminal Mod_out of the latter-stage frequency division unit serves as the input of the modulus signal input terminal Mod_in of the former-stage frequency division unit. However, an extension stage circuit, which is constituted by a NOT gate and an NAND gate connected between the second-stage frequency division unit and the third-stage frequency division unit, is arranged between the basic frequency division unit and the extended frequency division unit (i.e. between the second-stage and the third-stage frequency division units), thus, the input of the modulus signal input terminal Mod_in of the second-stage frequency division unit can be expressed by the following equation: $(Mod\_in)_2 = \overline{P_3 \cdot (Mod\_out)_3}$, where $(Mod\_out)_3$ represents the output from the modulus signal output terminal Mod_out of the third-stage frequency division unit, and $P_3$ represents the divisor control signal of the third-stage frequency division unit. When the divisor control signal $P_3$ is equal to 0, $(Mod\_in)_2 = \overline{P_3 \cdot (Mod\_out)_3} = 1$, and value of the frequency division control bit signal P3P2P1P0 of the frequency divider may range from 0100 to 0111, that is, the frequency division ratio of the frequency divider is in the range of 4 to 7. In this case, only the first two stages of frequency division units are operating, and the third-stage frequency division unit receives the divisor control signal P3 having a value of 0 through the reset/set control signal terminal SET and output a state output signal QL1_3=1, thus the output clock signal with the lowered frequency QL1_TOTB=$\overline{QL1\_2 \cdot QL1\_3}$=$\overline{QL1\_2}$, which is determined by merely the state output signal of the second-stage frequency division unit. When the divisor control signal P3 has a value of 1, (Mod_in)$_2$=$\overline{P_3(Mod\_out)_3}$=(Mod_out)$_3$, and the value of the frequency division control bit signal P3P2P1P0 of the frequency divider may range from 1000 to 1111, that is, the frequency division ratio of the frequency divider is in the range of 8 to 15. In this case, each of the three stages of frequency division units is in operating, and the output clock signal with the lowered frequency QL1_TOTB=$\overline{QL1\_2 \cdot QL1\_3}$ is determined by both of the state outputs of the second-stage and the third-stage frequency division units.

As described above, when the frequency division unit is in an operating state, it indicates that the state code of the frequency division unit continuously changes; and when the frequency division unit is in a non-operating state, it indicates that the state code of the frequency division unit remains constant.

Each of the frequency division units contains four flip-flops, with the state outputs of these flip-flops being represented as QL1, QL2, QL3, and QL4, respectively, thus a state combination QL1QL2QL3QL4 of the four flip-flops may be represented by state codes in Table 1 below, in which any states that will not occur in the state cycle of the frequency division unit are not shown in Table 1.

TABLE 1

| State code | Fin | Fout | Mod_out | QL1QL2QL3QL4 |
|---|---|---|---|---|
| 0 | 0 | 1 | 0 | 0000 |
| 1 | 0 | 1 | 1 | 0001 |
| 2 | 1 | 1 | 0 | 0010 |
| 3 | 0 | 1 | 1 | 0011 |
| 4 | 1 | 0 | 0 | 0100 |
| 5 | 1 | 0 | 1 | 0101 |
| 8 | 1 | 1 | 0 | 1000 |
| C | 0 | 0 | 0 | 1100 |

Figure 2A:
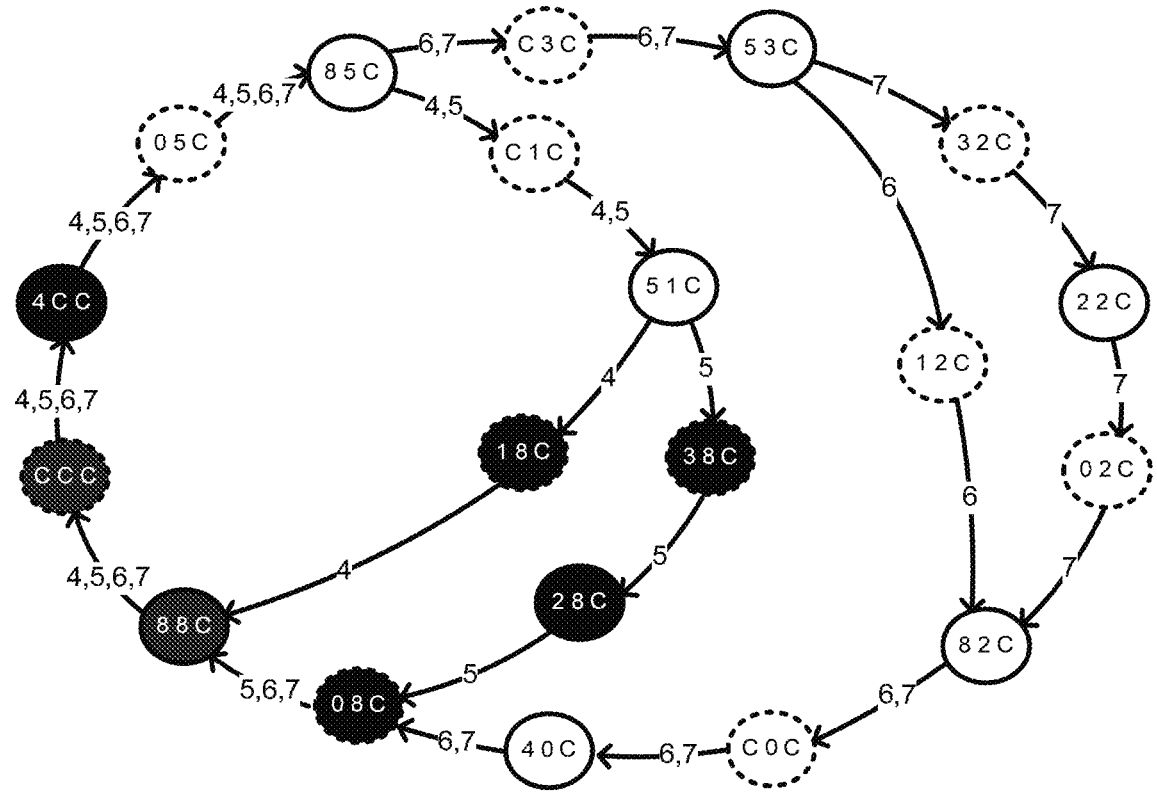
FIGS. 2a and 2b are state transition diagrams of the multi modulus frequency divider in the prior art.

FIG. 2a shows the state transition diagram of the first two frequency division units of the multi modulus frequency divider shown in FIG. 1a when the frequency division ratios of the multi modulus frequency divider are 4, 5, 6, and 7. As analyzed above, in this case, the reset/set control signal terminal SET of the third-stage frequency division unit receives the divisor control signal P3=0, thus the state combination QL1QL2QL3QL4 of the third-stage frequency division unit is 1100, that is, the state is remained as C, and the state output signal QL1_3 is 1.

Figure 2B:
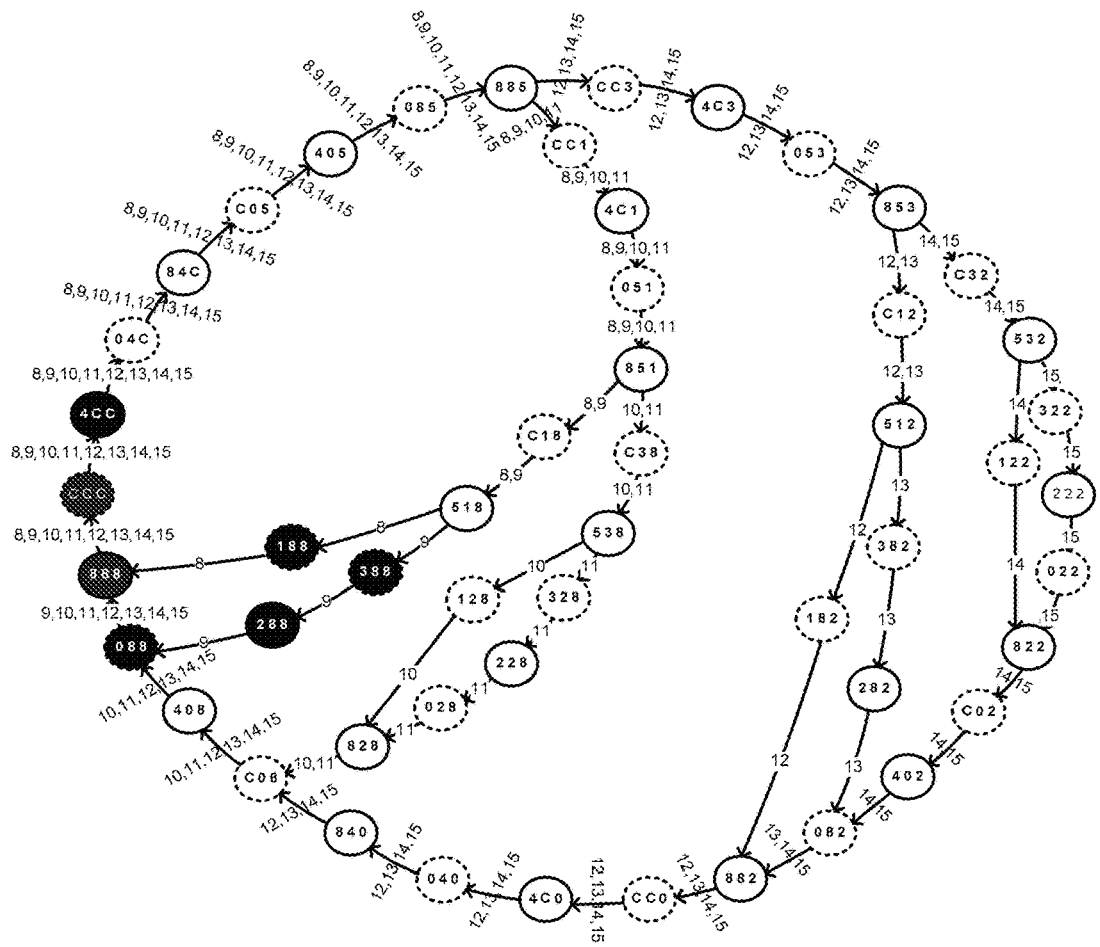

FIG. 2b shows the state transition diagram of the three frequency division units of the multi modulus frequency divider of FIG. 1a which are all operating, when the frequency division ratio of the multi modulus frequency divider is from 8 to 15.

As shown in FIG. 2a, numbers inside the ellipses indicate the current states of the respective frequency division units. Each black ellipse indicates a low level of the resultant output clock signal QL1_TOTB, and each white ellipse indicates a high level of the resultant output clock signal QL1_TOTB. Further, each ellipse shown in a solid line indicates that the input clock signal Fin of the multi modulus frequency divider is in a high-level state, and each ellipse shown in a dotted line indicates that the input clock signal Fin of the multi modulus frequency divider is in a low-level state. The number(s) along with each arrow connecting two adjacent states indicates the frequency division ratio(s). For example, in the case where the frequency division ratio is 4, the three stages of frequency division units have the following cycle of eight states: 88C→CCC→4CC→05C→85C→C1C→51C→18C→88C, where each state occupies a half of the input clock cycle, and the cycle of eight states indicates that the output clock cycle of the frequency divider includes four input clock cycles, achieving the frequency division ratio of 4. Moreover, four states 05C, 85C, C1C and 51C among these eight states are represented by white ellipses indicating the high level of the output clock signal QL1_TOTB, and the remaining four states 88C, CCC, 4CC and 18C are represented by black ellipses indicating the low level of the output clock signal QL1_TOTB, thus the duty cycle of the output clock signal QL1_TOTB is 50%. Through the color of the ellipses in the state diagram, the duty cycle of the output signal corresponding to the frequency division ratio can be shown intuitively.

Figure 3:
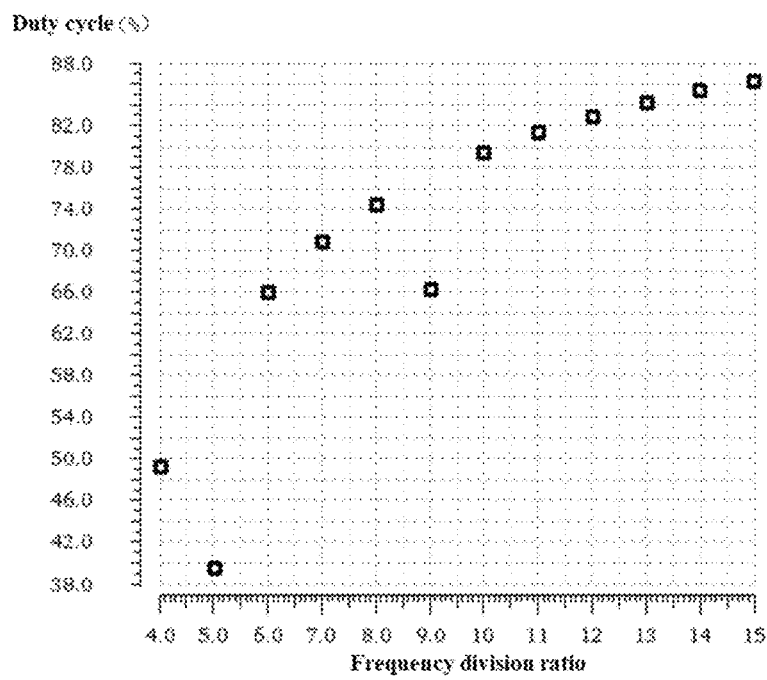
FIG. 3 is a schematic diagram of a relationship between the frequency division ratio and the duty cycle of the multi modulus frequency divider in the prior art.

FIG. 3 summarizes a relationship between the duty cycle of the output signal and the frequency division ratio of the three-stage frequency divider. It can be seen from FIGS. 2a and 2b that, for most frequency division ratios, there are more white ellipses than black ellipses, that is, the output clock signal after frequency division is at a high level for most of its cycle, therefore, the duty cycle in FIG. 3 deviates significantly from 50%. The more the duty cycle of a clock signal deviates from 50%, the greater the power consumption of a digital circuit depending on the clock signal is, and the more unstable the digital circuit is.

The inventor of the present disclosure conducted research on the prior art and found that, in order to improve the duty cycle of the output signal, it is only necessary to reduce the number of white ellipses for each frequency division ratio, as can be seen from the state diagram. In the technical solution shown in FIG. 1a, the falling edge (from the high-level state to the low-level state) of the output signal should not be generated from the output signal $\overline{QL1\_2 \cdot QL1\_3}$ as like in the prior art. Instead, another signal in the circuit needs to be used to trigger the falling edge of the output signal, thereby optimizing the duty cycle of the output signal. However, at the same time, it is necessary to maintain the state transition diagram in the prior art unchanged, so that the frequency division ratio can still be switched arbitrarily. In order to achieve this, the rising edge of the resultant output signal (i.e., the second output clock signal) used to switch the frequency division ratio is still based on the rising edge of the first output clock signal.

Based on the above inventive concepts, an embodiment of the present disclosure proposes a multi modulus frequency divider including a plurality of frequency division units connected in cascade, a clock output circuit, and a duty cycle adjusting circuit.

Each of the plurality of frequency division units, which includes a plurality of D flip-flops and a combinational logic unit, divides the frequency of the received clock signal by N or by N+1 depending on the corresponding received divisor control signal and the corresponding input modulus signal, and an output of the preselected one of the D flip-flops in each of the plurality of frequency division units serves as a state output of the frequency division unit, where N is an integral larger than 1.

The clock output circuit is configured to generate a first output clock signal according to a state output of the frequency division unit, and a state code combination composed of the state codes of the plurality of frequency division units connected in cascade is the same for any of the frequency division ratios supported by the multi modulus frequency divider, before a rising edge of the first output clock signal.

Specifically, both the frequency division unit and the clock output circuit have the existing structures disclosed in the above-mentioned reference document, and each frequency division unit divides the frequency of the received clock signal by 2 or by 3 depending on its received divisor control bit signal and the input modulus signal provided by the next stage of frequency division unit, and outputs a modulus signal to the preceding stage of frequency division unit. Alternatively, the output modulus signal may be inputted to an extension stage circuit and provided by the extension stage circuit as an input modulus signal for the preceding stage frequency division unit). Here, each of the frequency division units includes a plurality of D flip-flops and a combinational logic unit. The clock output circuit is configured to generate the rising edge of the first output clock signal according to the golden states of the frequency division units connected in cascade, thereby ensuring the accuracy of the frequency of the output clock signal when the frequency division ratio of the multi-mode frequency divider is arbitrarily switched.

The duty cycle adjusting circuit is configured to generate a second output clock signal according to the rising edges of the first output clock signal and the modulus signal received by one or more of the frequency division units connected in cascade, where the frequency of the second output clock signal is the same as that of the first output clock signal, and the duty cycle of the second output clock signal is different from that of the first output clock signal.

In the above technical solution, the golden state corresponds to the rising edge of the first output clock signal. Alternatively, the golden state may correspond to the falling edge of the first output clock signal.

Therefore, a variant of the above solution is provided in a further embodiment of the present disclosure and proposes a multi modulus frequency divider which includes a plurality of frequency division units connected in cascade, a clock output circuit, and a duty cycle adjusting circuit, where each of the plurality of frequency division units, which includes a plurality of D flip-flops and a combinational logic unit, is configured to divide the frequency of the received clock signal by N or by N+1 depending on the corresponding received divisor control signal and the corresponding input modulus signal, and an output of the preselected one of the D flip-flops in each frequency division unit serves as a state output of the frequency division unit, where N is an integral larger than 1; the clock output circuit is configured to generate a first output clock signal according to the state output of at least two of the plurality of frequency division unit, here the state code combination composed of the state codes of the plurality of frequency division units is the same for any of the frequency division ratios supported by the multi modulus frequency divider before a falling edge of the first output clock signal; and the duty cycle adjusting circuit is configured to generate a second output clock signal according to the falling edge of the first output clock signal and the input modulus signal received by one or more of the plurality of frequency division units, where the frequency of the second output clock signal is the same as that of the first output clock signal, and the duty cycle of the second output clock signal is different from that of the first output clock signal.

Illustratively, in some embodiments, for optimization based on the circuit structure shown in FIGS. 1a and 1b, the duty cycle adjusting circuit is particularly configured to:

synchronize the rising edge of the second output clock signal with the rising edge of the first output clock signal, so that frequency division ratios can be switched as desired. Meanwhile, the falling edge of the second output clock signal is triggered by the input modulus signal received by one or more of the frequency division units connected in cascade, that is, the second output clock signal is changed to a low level after being maintained at a high level for a certain period of time. Depending on the operating frequency division ratio, the input modulus signal of a corresponding stage of frequency division unit is flexibly selected to trigger the falling edge of the second clock signal, thereby optimizing the duty cycle of the output clock signal of the multi modulus frequency divider.

Figure 4A:
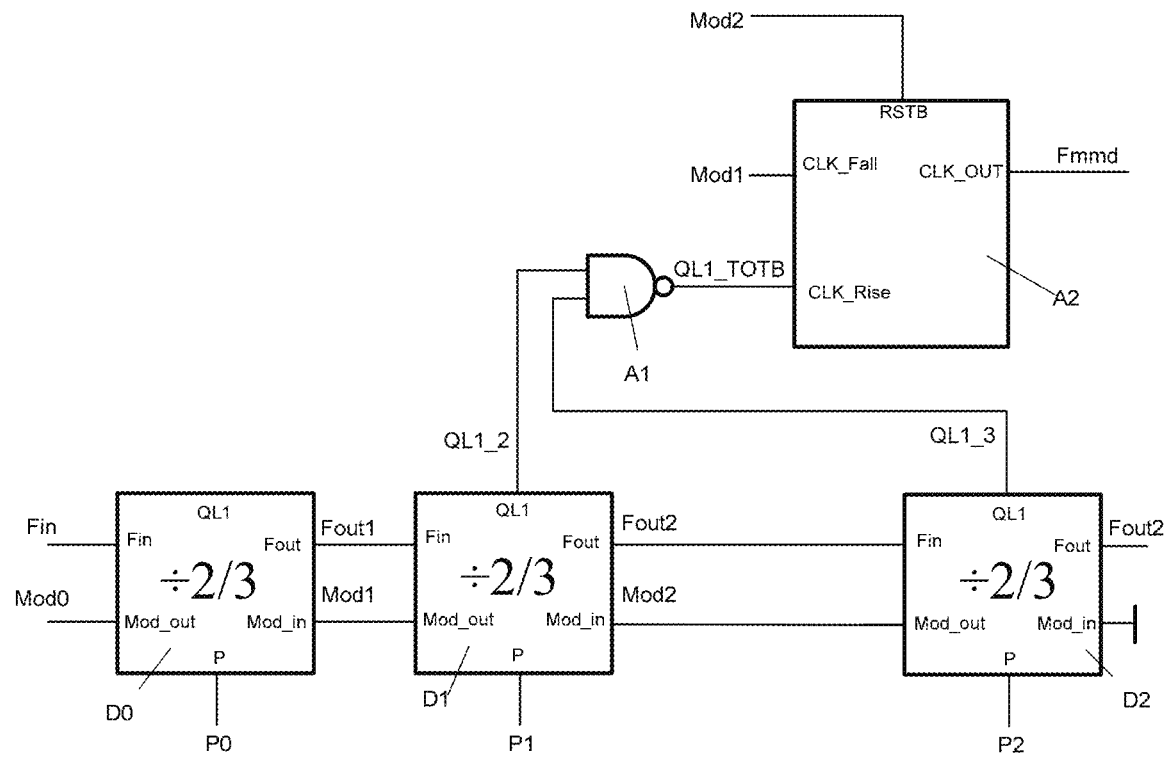
FIG. 4a is a circuit diagram of a multi modulus frequency divider (without extension stage) according to an embodiment of the present disclosure.

FIG. 4a is a circuit diagram of a three-stage multi modulus frequency divider proposed in the present disclosure, and frequency division units connected in cascade in the multi modulus frequency divider do not include an extension stage. According to the analysis of the prior art, the minimum and maximum frequency division ratios of the multi modulus frequency divider without extension stage are $2^n$ and $(2^{n+1}-1)$, respectively, where n represents the number of stages of the frequency division units, thus the frequency division ratio of the three-stage frequency divider without extension stage ranges from 8 to 15. It can be seen from FIG. 4a that frequency division units D0, D1, and D2 are connected sequentially in series, and the latter-stage frequency division unit provides an input modulus signal for the preceding-stage frequency division unit. Three control bit signals P0, P1, and P2 are respectively provided to the divisor control bit input terminals P of the three frequency division units D0, D1, and D2. The state output QL1_2 of the second-stage frequency division unit and the state output QL1_3 of the third-stage frequency division unit are provided to an NAND gate A1 (that is, the above-described clock output circuit), and the output of the NAND gate A1 serves as the first output clock signal QL1_TOTB. The above is the same as the prior art.

Figure 4B:
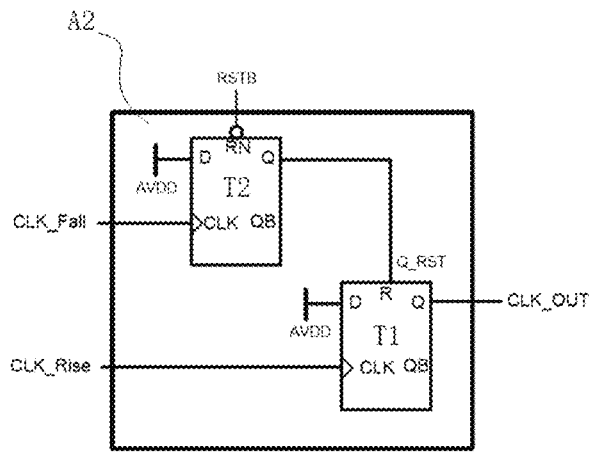

A duty-cycle adjusting element A2 is further provided in the duty-cycle adjusting circuit. As shown in FIG. 4b, the duty cycle adjusting element A2 has a clock signal input terminal CLK_Rise, a clock signal input terminal CLK_Fall, a reset terminal RSTB, and a clock signal output terminal CLK_OUT. The operation principle of the duty cycle adjusting element A2 is that: when the clock signal at the clock signal input terminal CLK_Rise is at the rising edge and the reset terminal RSTB is set as 0, the clock signal output terminal CLK_OUT is set as 1; and when the clock signal at the clock signal input terminal CLK_Fall is at the rising edge and the reset terminal RSTB is set as 1, the clock signal output terminal CLK_OUT is set as 0.

Specifically, referring to FIGS. 4a and 4b, the duty cycle adjusting element A2 includes a first D flip-flop T1 and a second D flip-flop T2, the first output clock signal QL1_TOTB is provided as an input clock signal of the first D flip-flop T1, a state input terminal D of the first D flip-flop T1 is configured to receive a high-level power supply signal AVDD, and a state output terminal Q of the first D flip-flop T1 is configured to output the second output clock signal Fmmd. A state input terminal D of the second D flip-flop T2 is configured to receive the power supply signal AVDD, the reset terminal RN of the second D flip-flop T2 is configured to receive the input modulus signal Mod2 of the second-stage frequency division unit, the clock signal input terminal CLK of the second D flip-flop T2 is configured to receive the input modulus signal Mod1 of the first-stage frequency division unit, and the state output terminal Q of the second D flip-flop T2 is connected to the reset terminal R of the first D flip-flop T1. It should be noted that, Mod2 and Mod1 correspond to the input modulus signal of the second-stage frequency division unit and the input modulus signal of the first-stage frequency division unit, respectively, i.e. the output modulus signal $(Mod\_out)_3$ from the third-stage frequency division unit and the output modulus signal $(Mod\_out)_2$ from the second-stage frequency division unit. As shown in FIGS. 1b and 1c, signals $(Mod\_out)_3$ and $(Mod\_out)_2$ correspond to signals $(QL4)_3$ and $(QL4)_2$, respectively. Here, the subscript in the numeral for each signal represents the sequential stage number of the frequency division unit providing the signal.

Figure 4C:
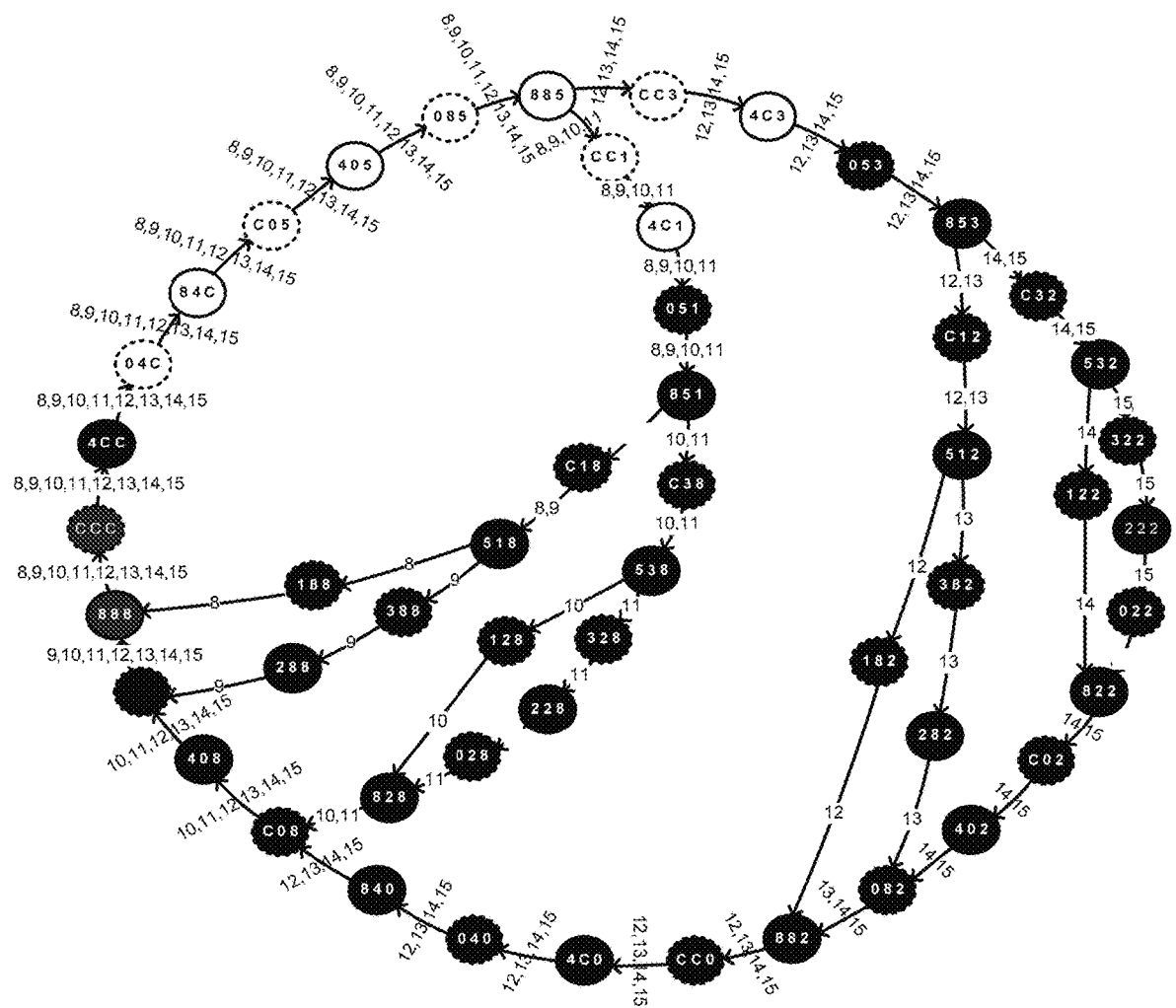

FIG. 4c is a state transition diagram of the circuit shown in FIG. 4a. For example, when the frequency division ratio is 8, there are 16 states in a state cycle, and each of the 16 states lasts for a half of the cycle of the input signal. When the state code combination composed of the state codes of the three frequency division units is transitioned from 4CC to 04C, for the state code combination 4CC, the states of the second-stage frequency division unit and the third-stage frequency division unit together are CC, thus QL1_2=QL1_3=1 can be obtained with reference to Table 1, and hence the output QL1_TOTB is 0 because of QL1_TOTB=$\overline{QL1\_2 \cdot QL1\_3}$. For the state conde combination 04C, the states of the second-stage frequency division unit and third-stage frequency division unit together are 4C, thus QL1_2=0 and QL1_3=1 with reference to Table 1, and hence the output QL1_TOTB is 1. That is, the time point when the state code combination is transitioned from 4CC to 04C corresponds to the rising edge of the input signal CLK_rise of the duty cycle adjusting element A2. Meanwhile, in the case of both the state code combinations 4CC and 04C, the state of the third-stage frequency division unit is C and hence $(QL4)_3$=0, thus Mod2=0 and the reset RSTB of the duty cycle adjusting element A2 follows RSTB=Mod2=0, as can be seen from FIG. 4b, as a result, the rising edge of the input clock signal CLK_Rise=QL1_TOTB of the first D flip-flop T1 causes the resultant output second clock signal CLK_OUT (that is, the output Fmmd in FIG. 4a) to be changed to a high level, and hence the state code combination 04C in the state diagram of FIG. 4c becomes white. When the state code combination is transitioned from 4C1 to 051, the state of the second-stage frequency division unit changes from C to 5, and it can be seen with reference to Table 1 that $(QL4)_2$ changes from 0 to 1, that is, at this point, the clock signal Mod1 for the second D flip-flop T2 of the duty cycle adjusting element A2 is in a rising edge, moreover, the state of the third-stage frequency division unit is 1, and it can be seen with reference to Table 1 that $(QL4)_3$=1, that is, at this point, the signal Mod2 for the reset terminal RN of the second D flip-flop T2 of the duty cycle adjusting element A2 is 1, thus the output Q_RST of the second D flip-flop T2 is 1, thereby resetting the output signal CLK_OUT of the first D flip-flop T1, so that the second output clock signal Fmmd of FIG. 4a changes from 1 to 0, and the state code combination 04C in the state diagram of FIG. 4c changes from white to black.

Figure 5A:
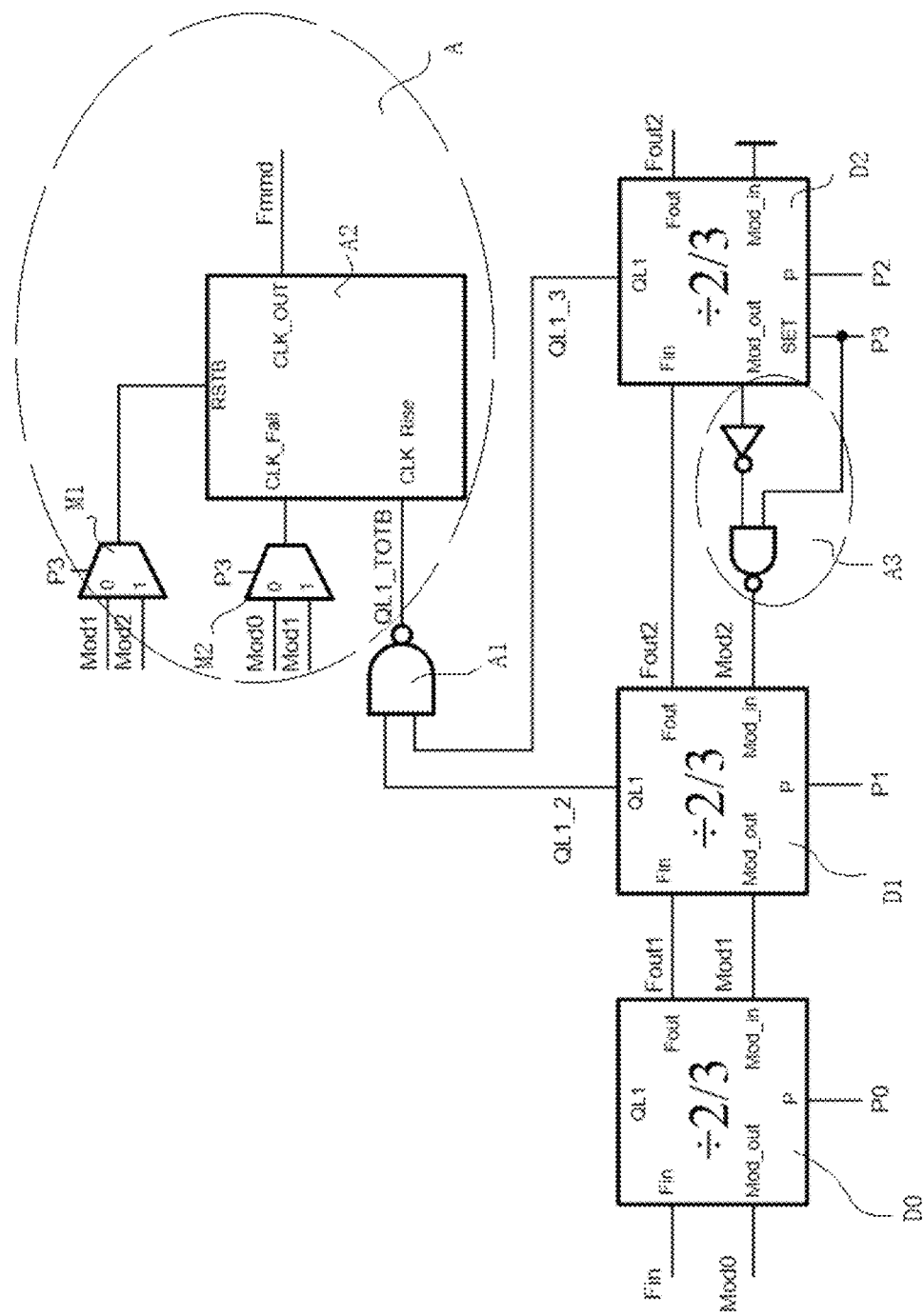
FIG. 5a is a circuit diagram of a three-stage multi modulus frequency divider (with extension stage) according to an embodiment of the present disclosure.

It should be noted that, the adjustment of the duty cycle of the first output clock signal of the multi modulus frequency divider does not depend on whether the frequency division units connected in cascade in the multi modulus frequency divider are provided with an extension stage. Compared with FIG. 4a, FIG. 5a shows that an extension stage circuit A3, which is composed of a NOT gate and an NAND gate in cascade connection, is added. Referring to the above-described analysis, when the divisor control signal P3 is equal to 0, Mod2=$(Mod\_in)_2$=$\overline{P_3 \overline{(Mod\_out)_3}}$=1, in this case, only the first two stages of frequency division units are operating, and the frequency division ratio supported by the multi modulus frequency divider is from 4 to 7; and when the divisor control signal P3 is equal to 1, Mod2= $(Mod\_in)_2$=$\overline{P_3 \overline{(Mod\_out)_3}}$=$(Mod\_out)_3$, in this case, the connection of the third-stage frequency division unit to the second-stage frequency division unit is the same as that shown in FIG. 4a, and the frequency division ratio of the frequency divider ranges from 8 to 15.

Figure 5B:
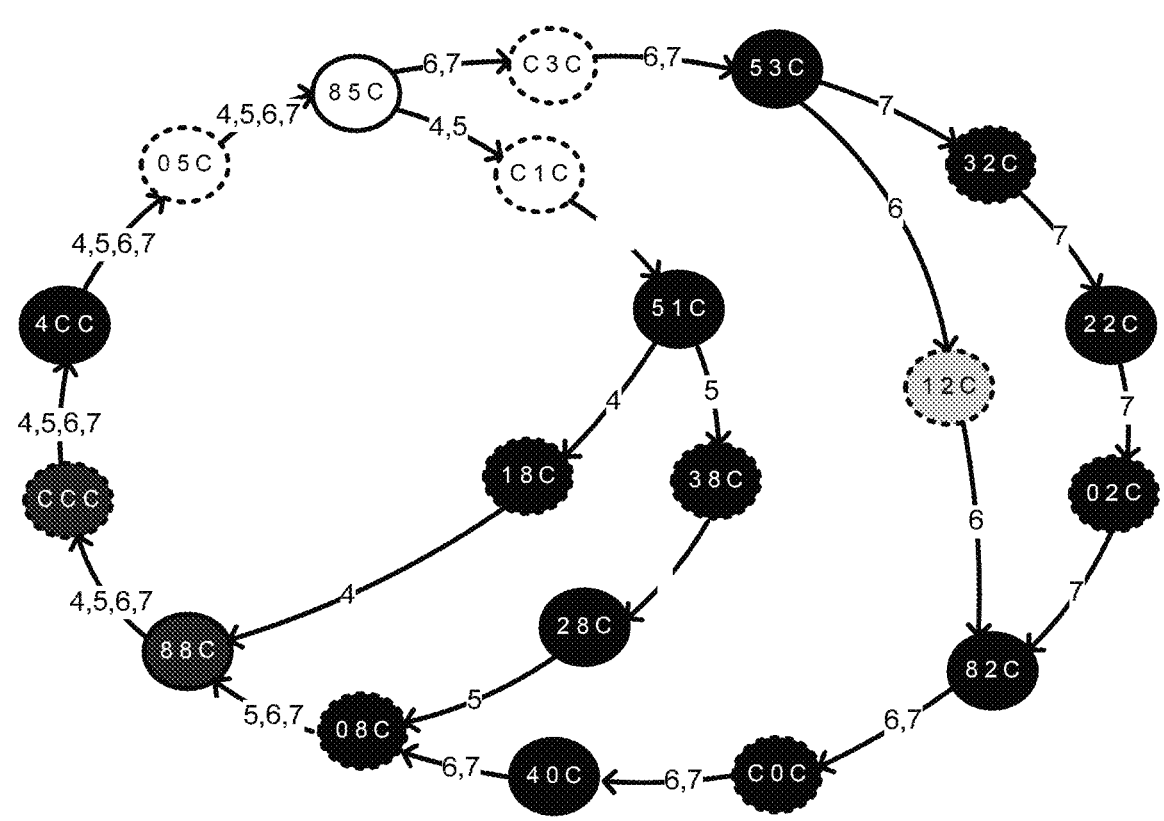

The duty cycle adjusting circuit A in FIG. 5a is additionally provided with two multiplexers M1 and M2 compared to that in FIG. 4a, and the input clock signal for the terminal CLK_Fall and the reset signal for the terminal RSTB of the duty cycle adjusting element A2 under different divisors are selected according to the divisor control signal P3 of the third-stage frequency division unit. Particularly, when the divisor control signal P3 is equal to 1, the signal Mod1 is input to the terminal CLK_Fall and the signal Mod2 is input to the terminal RSTB, as like in FIG. 4a; and when the divisor control signal P3 is equal to 0, the signal Mod0 is input to the terminal CLK_Fall and the signal Mod1 is input to the terminal RSTB, and it can be obtained from the similar analysis that, when the divisor control signal P3 is equal to 0, the state transition diagram for the frequency division ratio from 4 to 7 is as shown in FIG. 5b, where the number of black ellipses is increased compared with the state transition diagram of the prior art in FIG. 2a.

Figure 5C:
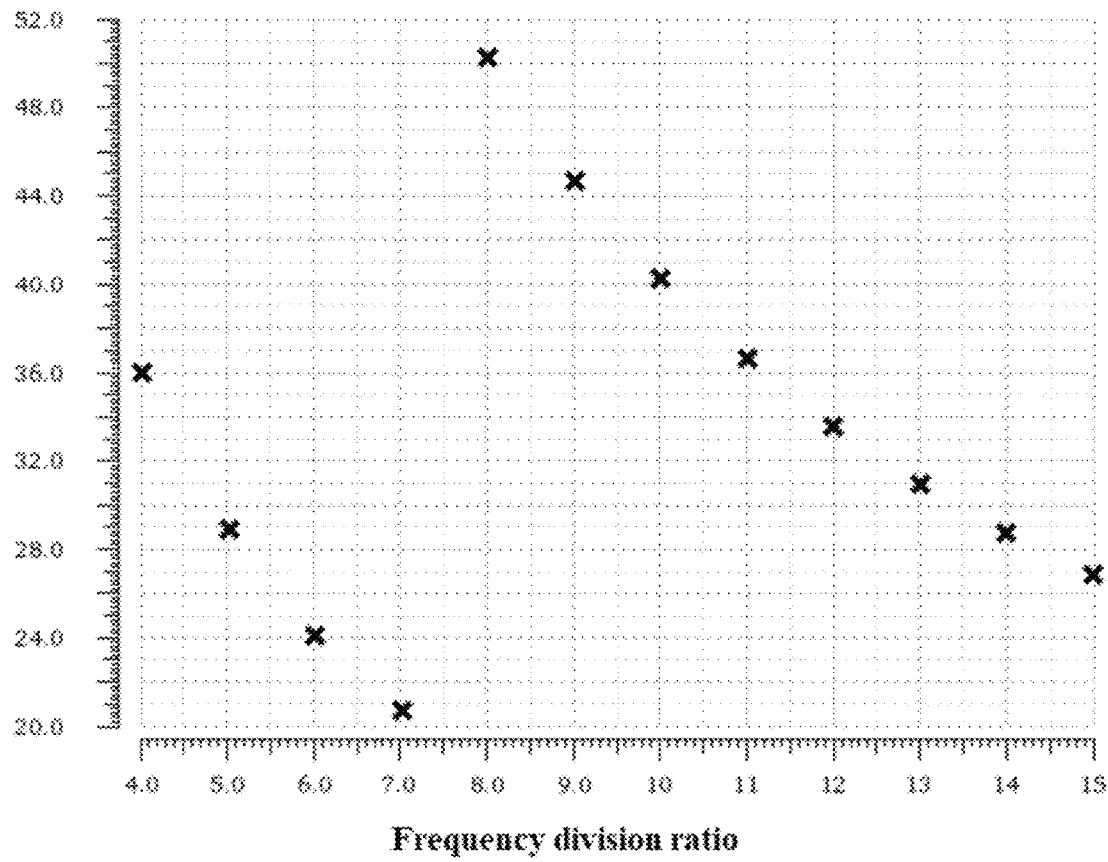

FIG. 5c shows the duty cycles of the output signal of the circuit of FIG. 5a under different frequency division ratios. Compared with FIG. 3, with the introduction of the duty cycle adjusting circuit, although the duty cycles corresponding to a small part of the frequency division ratios (for example, 4) are more deviated from 50%, the duty cycles corresponding to most frequency division ratios are closer to 50%.

Figure 6A:
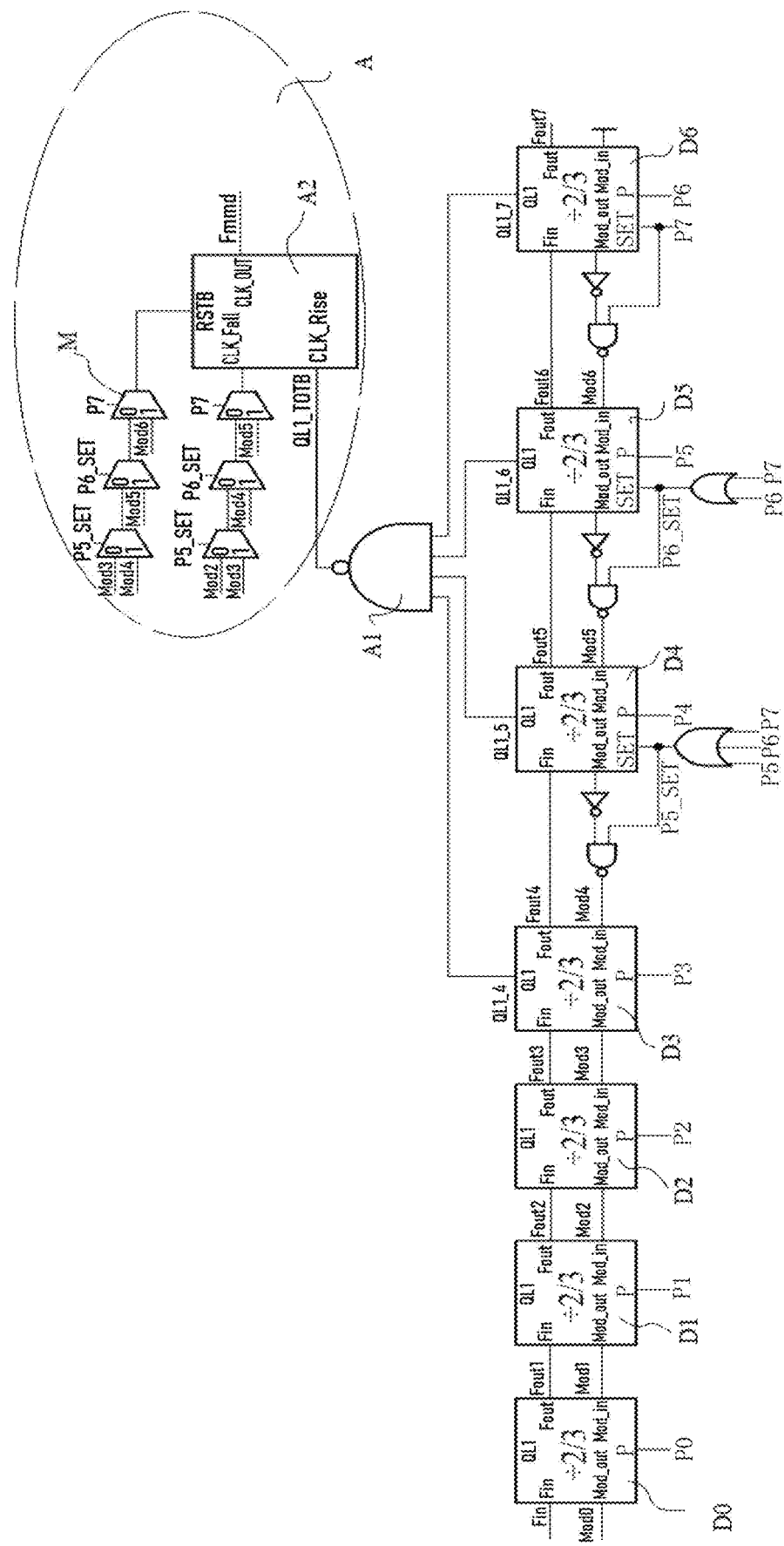
FIG. 6a is a circuit diagram of a multi modulus frequency divider according to another embodiment of the present disclosure.
Figure 6B:
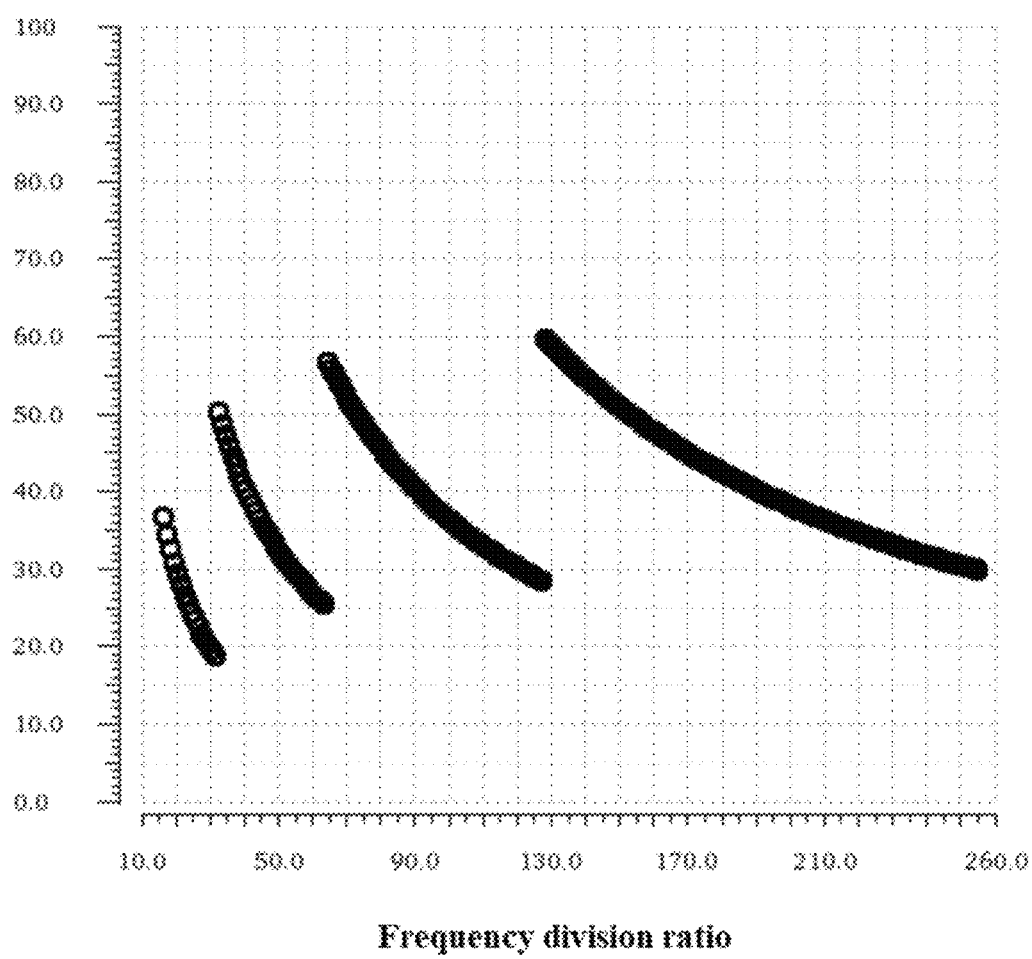
Figure 6C:
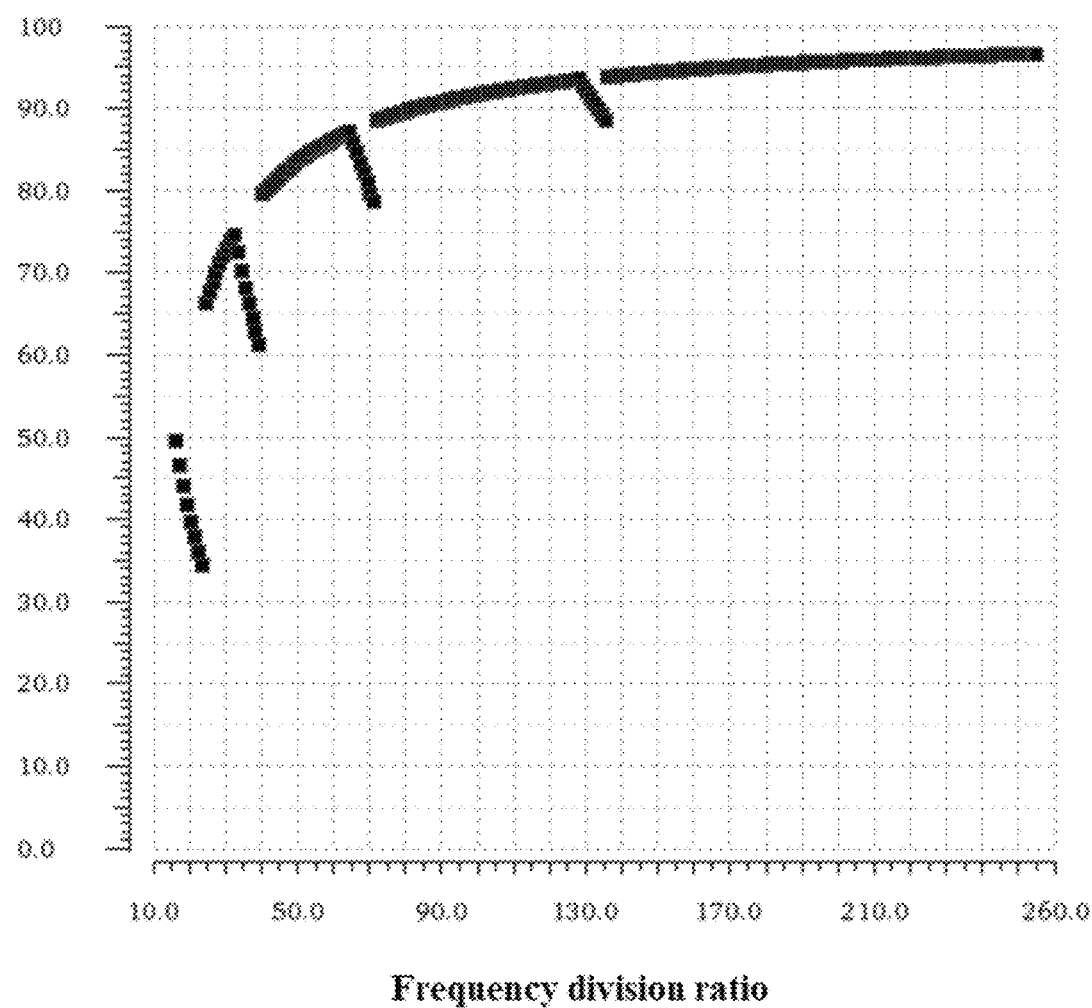
FIG. 6c is a schematic diagram of a relationship between the frequency division ratio and the duty cycle of the multi modulus frequency divider in the prior art.

The above design conception can be applied to any specific multi modulus frequency divider with any specific number of stages of basic frequency division units and any specific number of stages of extended frequency division units. Referring to FIG. 6a, when there are 7 stages of the frequency division units D0 to D6, including three stages of extended frequency division units D4 to D6, the frequency division ratios can range from 16 to 255. The clock output circuit A1 is configured to generate a first output clock signal according to the state outputs of the frequency division units D3 to D6 of the frequency division units D0 to D6. FIG. 6b and FIG. 6c are schematic diagrams of duty cycles of the output signals of the multi modulus frequency divider in the present disclosure and the multi modulus frequency divider in the prior art, respectively. By comparing FIG. 6b with FIG. 6c, it can be seen that the duty cycles corresponding to various frequency division ratios are generally closer to 50% with the introduction of the duty cycle adjusting circuit A.

It should be noted that, the above design conception of the duty cycle adjusting circuits, i.e. one of the falling and rising edges of the resultant output clock signal of the duty cycle adjusting circuit is generated according to the falling edge or rising edge of a signal in the prior art which has an unideal duty cycle and the other of the falling and rising edges of the resultant output clock signal of the duty cycle adjusting circuit is triggered by other state output signal(s) so that the duty cycle of the resultant output clock signal can be generally improved, is also applicable to other types of circuit structures.

It should be noted that, those skilled in the art can make changes to the circuits of FIGS. 4a, 4b, 5a and 6a without departing from the inventive concepts of the present disclosure. For example, the second output clock signal may be alternatively output from the QB terminal of the D flip-flop T1 in FIG. 4b. For another example, if the "golden state" corresponds to the position of the falling edge of the first output clock signal, the first output clock signal is inverted and then provided to the duty cycle adjusting element A2.

It should be further noted that, the frequency division units connected in cascade, the clock output circuit, and the extension stage circuit can also be of other known circuit structures, as long as the falling edge or rising edge of the clock signal output by the clock output circuit corresponds to the "golden state".

In addition, the logic implemented by the duty cycle adjusting element A2 can also be varied. For example, the duty cycle adjusting element may be modified to generate the rising or falling edge of the second clock signal according to the transition of the first clock signal at the "golden state", and generate the falling or rising edge of the second clock signal according to the transition of a combinational logic signal which is formed by two or three modulus signals and has a cycle equal to that of the first clock signal. After the logic of the duty cycle adjusting element is determined, those skilled in the art can easily design its specific circuit configuration.

It should be noted that the frequency division ratio of the frequency division unit can be 2 or 3, or can be 3 or 4, but the present disclosure is not limited thereto.

An embodiment of the present disclosure also provides an electronic device including the above described multi modulus frequency divider. The electronic device may be a component or a consumer product such as a mobile phone, which includes the multi modulus frequency divider.

The various embodiments in the present disclosure are described in a progressive manner, and the same or similar parts between the various embodiments can be referred to each other, and the description of each subsequent embodiment focuses on the differences from the preceding embodiments.

The protection scope of the present disclosure is not limited to the above embodiments. It is obvious that, those skilled in the art can make various amendments and modifications to the present disclosure without departing from the scope of the present disclosure. If these amendments and modifications fall within the scope of the claims of the present disclosure and its equivalent technology, the present disclosure is also intended to include these amendments and modifications.

What is claimed is:

1. A multi modulus frequency divider comprising a plurality of frequency division units connected in cascade, a clock output circuit and a duty cycle adjusting circuit, wherein,
    each of the plurality of frequency division units, which includes a plurality of D flip-flops and a combinational logic unit, is configured to divide a frequency of a received clock signal by N or by N+1 depending on a corresponding received divisor control signal and a corresponding input modulus signal, and an output of the preselected one of the D flip-flops in each of the plurality of frequency division units serves as a state output of the frequency division unit, wherein N is an integral larger than 1;
    the clock output circuit is configured to generate a first output clock signal according to the state outputs of at least two of the plurality of frequency division units, wherein a state code combination composed of state codes of the plurality of frequency division units is the same for any of frequency division ratios supported by the multi modulus frequency divider before a rising edge of the first output clock signal;
    the duty cycle adjusting circuit is configured to generate a second output clock signal according to the rising edge of the first output clock signal and the input modulus signal received by one or more of the plurality of frequency division units, wherein the frequency of the second output clock signal is the same as that of the first output clock signal, and the duty cycle of the second output clock signal is different from that of the first output clock signal.

2. The multi modulus frequency divider of claim 1, wherein the duty cycle adjusting circuit is configured to:
    determine a position of a rising edge of the second output clock signal according to a position of the rising edge of the first output clock signal; and
    determine a position of a falling edge of the second output clock signal according to the input modulus signal received by one or more of the plurality of frequency division units.

3. The multi modulus frequency divider of claim 2, wherein the duty cycle adjusting circuit comprises a first D flip-flop and a second D flip-flop,
    the first output clock signal is input to an input clock signal terminal of the first D flip-flop, a state input terminal of the first D flip-flop is configured to receive a high-level power supply signal, and a state output terminal of the first D flip-flop is configured to output the second output clock signal;
    an input clock signal terminal of the second D flip-flop is configured to receive a modulus signal of one of the frequency division units, a state input terminal of the second D flip-flop is configured to receive a high-level power supply signal, a reset terminal of the second D flip-flop is configured to receive the input modulus signal of another one of the frequency division units, and a state output terminal of the second D flip-flop is connected to a reset terminal of the first D flip-flop.

4. The multi modulus frequency divider of claim 1, wherein the duty cycle adjusting circuit is configured to:
    determine a position of a falling edge of the second output clock signal according to a position of the rising edge of the first output clock signal; and
    determine a position of a rising edge of the second output clock signal according to the input modulus signal received by one or more of the frequency division units.

5. The multi modulus frequency divider of claim 1, further comprising: an extension stage circuit configured for selecting the number of stages of the frequency division units in an operating state according to the divisor control signal to increase the range of the selectable frequency division ratios for the first output clock signal, and for selecting an input modulus signal required for generating the second clock signal from the input modulus signals received by the plurality of frequency division units, according to the divisor control signal.

6. The multi modulus frequency divider of claim 5, wherein the duty cycle adjusting circuit comprises a multiplex selector.

7. The multi modulus frequency divider of claim 1, wherein N=2.

8. A multi modulus frequency divider comprising a plurality of frequency division units connected in cascade, a clock output circuit and a duty cycle adjusting circuit, wherein,
- each of the plurality of frequency division units, which includes a plurality of D flip-flops and a combinational logic unit, is configured to divide a frequency of a received clock signal by N or by N+1 depending on a corresponding received divisor control signal and a corresponding input modulus signal, and an output of the preselected one of the D flip-flops in each of the plurality of frequency division units serves as a state output of the frequency division unit, wherein N is an integral larger than 1;
- the clock output circuit is configured to generate a first output clock signal according to the state outputs of at least two of the plurality of frequency division units, wherein a state code combination composed of state codes of the plurality of frequency division units is the same for any of frequency division ratios supported by the multi modulus frequency divider before a falling edge of the first output clock signal;
- the duty cycle adjusting circuit is configured to generate a second output clock signal according to a falling edge of the first output clock signal and an input modulus signal received by one or more of the frequency division units, wherein a frequency of the second output clock signal is the same as that of the first output clock signal, and a duty cycle of the second output clock signal is different from that of the first output clock signal.

9. The multi modulus frequency divider of claim 8, wherein the duty cycle adjusting circuit is configured to:
- determine a position of a rising edge of the second output clock signal according to a position of the falling edge of the first output clock signal; and
- determine a position of a falling edge of the second output clock signal according to the modulus signal received by one or more of the plurality of frequency division units.

10. The multi modulus frequency divider of claim 8, wherein the duty cycle adjusting circuit is configured to:
- determine a position of a falling edge of the second output clock signal according to a position of the falling edge of the first output clock signal; and
- determine a position of a rising edge of the second output clock signal according to the input modulus signal received by one or more of the frequency division units.

11. The multi modulus frequency divider of claim 8, further comprising: an extension stage circuit configured for selecting the number of stages of the frequency division units in an operating state according to the divisor control signal to increase the range of the selectable frequency division ratios for the first output clock signal, and for selecting an input modulus signal required for generating the second clock signal from the input modulus signals received by the plurality of frequency division units, according to the divisor control signal.

12. The multi modulus frequency divider of claim 11, wherein the duty cycle adjusting circuit comprises a multiplex selector.

13. The multi modulus frequency divider of claim 8, wherein N=2.

14. An electronic device comprising the multi modulus frequency divider of claim 1.

* * * * *